(12) United States Patent
Gopal et al.

(10) Patent No.: US 9,473,168 B1
(45) Date of Patent: Oct. 18, 2016

(54) SYSTEMS, METHODS, AND APPARATUSES FOR COMPRESSION USING HARDWARE AND SOFTWARE

(71) Applicants: Vinodh Gopal, Westborough, MA (US); James D. Guilford, Northborough, MA (US); Gilbert M. Wolrich, Framingham, MA (US); Daniel F. Cutter, Maynard, MA (US)

(72) Inventors: Vinodh Gopal, Westborough, MA (US); James D. Guilford, Northborough, MA (US); Gilbert M. Wolrich, Framingham, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,746

(22) Filed: Sep. 25, 2015

(51) Int. Cl.
*H03M 7/00* (2006.01)
*H03M 7/30* (2006.01)

(52) U.S. Cl.
CPC .................. *H03M 7/3086* (2013.01)

(58) Field of Classification Search
CPC .......... H03M 7/3086; H03M 7/3084; H03M 7/3088; H03M 7/30; H03M 7/4006; H03M 7/40; H03M 13/09; H03M 7/42; H03M 7/46; H03M 7/48

USPC .................................. 341/50, 87, 106, 107
See application file for complete search history.

(56) References Cited

U.S. PATENT DOCUMENTS

| | | | | |
|---|---|---|---|---|
| 5,874,908 A * | 2/1999 | Craft | ...................... | G06T 9/005 341/87 |
| 8,694,703 B2 * | 4/2014 | Hans | ..................... | G06F 3/0613 707/797 |
| 2006/0273933 A1* | 12/2006 | Kerber | ................ | H03M 7/3084 341/50 |
| 2007/0061546 A1* | 3/2007 | Berger | .................... | H03M 7/30 711/202 |
| 2011/0154169 A1* | 6/2011 | Gopal | ................. | H03M 7/3084 714/807 |
| 2014/0223029 A1* | 8/2014 | Bhaskar | .............. | H03M 7/3088 709/247 |

* cited by examiner

*Primary Examiner* — Linh Nguyen
(74) *Attorney, Agent, or Firm* — Nicholson De Vos Webster & Elliott LLP

(57) ABSTRACT

Detailed herein are embodiments of systems, methods, and apparatuses for compression using hardware and software. Embodiments include compressor hardware to operate on two streams with one of the streams being an offset of the other stream. Additionally, in some embodiments, the output of the compressor hardware is submitted to software for further processing.

16 Claims, 16 Drawing Sheets

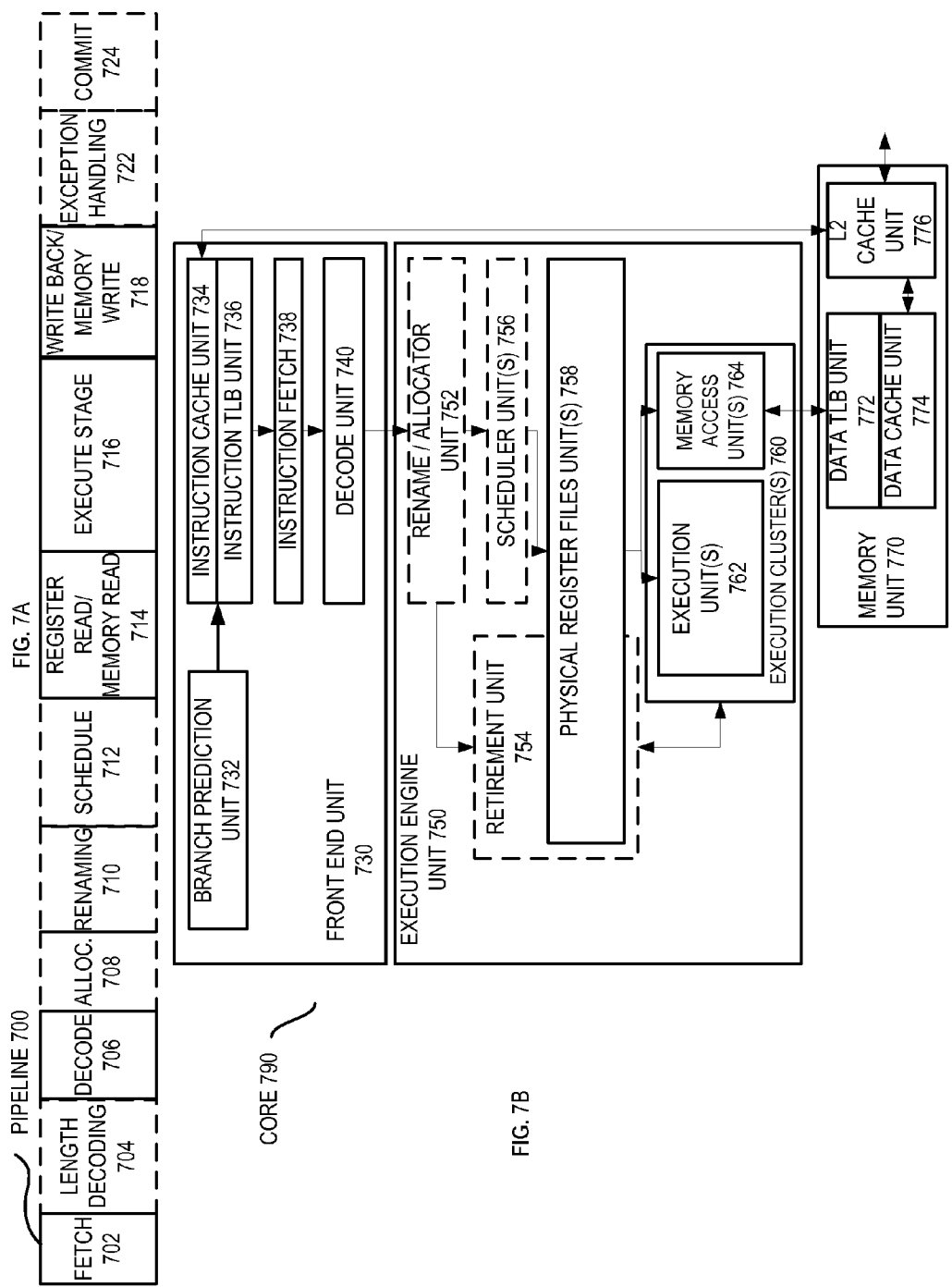

FIG. 15

PASS 1: L0 | L | L | L | R<3, 7K> | L | L | L | L | R<3, 5K> | L

PASS 2: L0 | R<3, 4K> | L | L | R<5, 8K> | L | L

MERGED: L0 | R<3, 4K + 8K> | L | R<3, 7K> | R<3, 8K + 8K> | R<3, 5K> | L

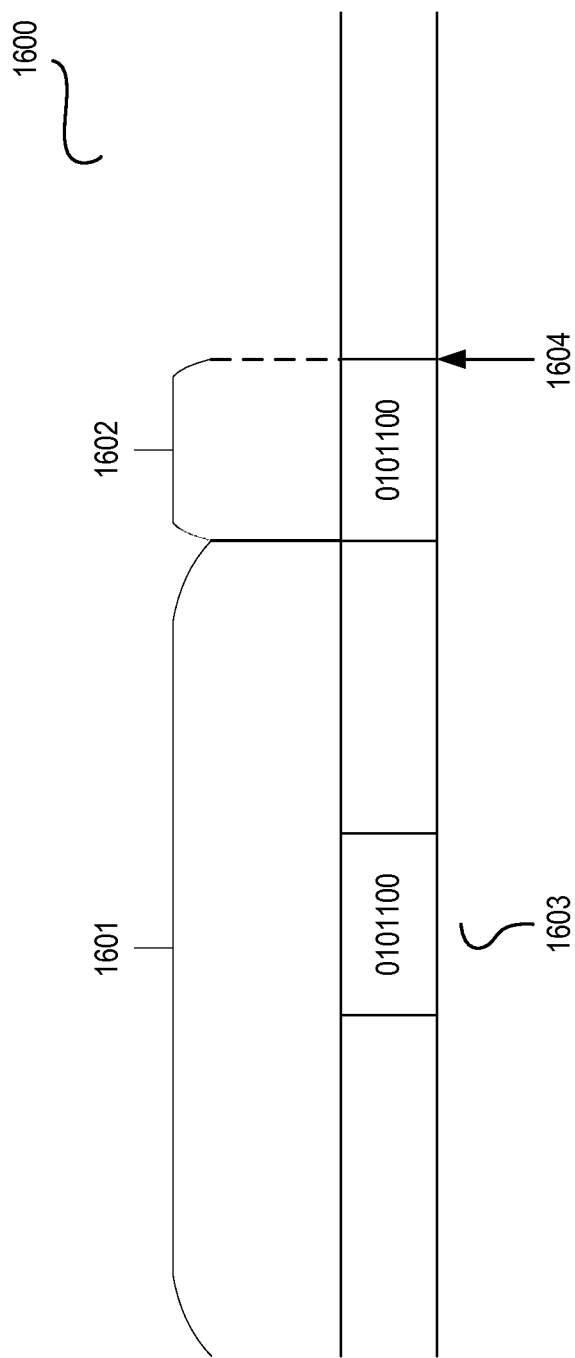

SYSTEMS, METHODS, AND APPARATUSES FOR COMPRESSION USING HARDWARE AND SOFTWARE

FIELD

The various embodiments described herein relate to compression techniques.

BACKGROUND

The cost of an LZ77 compressor is largely dominated by the amount of local memories required to hold the sliding history buffer, various hash and overflow tables. Typical implementations that need good compression ratio use ~3-5 times the memory as the history size defined in the algorithm. The different LZ77 based algorithms in use today unfortunately have a huge spread in history buffer sizes (e.g. LZS—2 KB, LZRW—4 KB, LZF—8 KB, Deflate—32 KB, LZO/LZ4—64 KB, Snappy—64 KB today, but can be larger)—current methods have to provide the worst-case implementation in hardware if higher compression ratios need to be achieved.

BRIEF DESCRIPTION OF THE DRAWINGS

The present invention is illustrated by way of example and not limitation in the figures of the accompanying drawings, in which like references indicate similar elements, and in which:

FIG. 7A is a block diagram illustrating both an exemplary in-order pipeline and an exemplary register renaming, out-of-order issue/execution pipeline according to embodiments of the invention.

FIG. 7B is a block diagram illustrating both an exemplary embodiment of an in-order architecture core and an exemplary register renaming, out-of-order issue/execution architecture core to be included in a processor according to embodiments of the invention.

FIG. 15 illustrates an example of merging multiple intermediate output streams. For simplicity only two outputs are merged, but this is easy to extend to any number.

FIG. 16 shows a simple example of an LZ77 encoding scheme.

DETAILED DESCRIPTION

Figure 1:
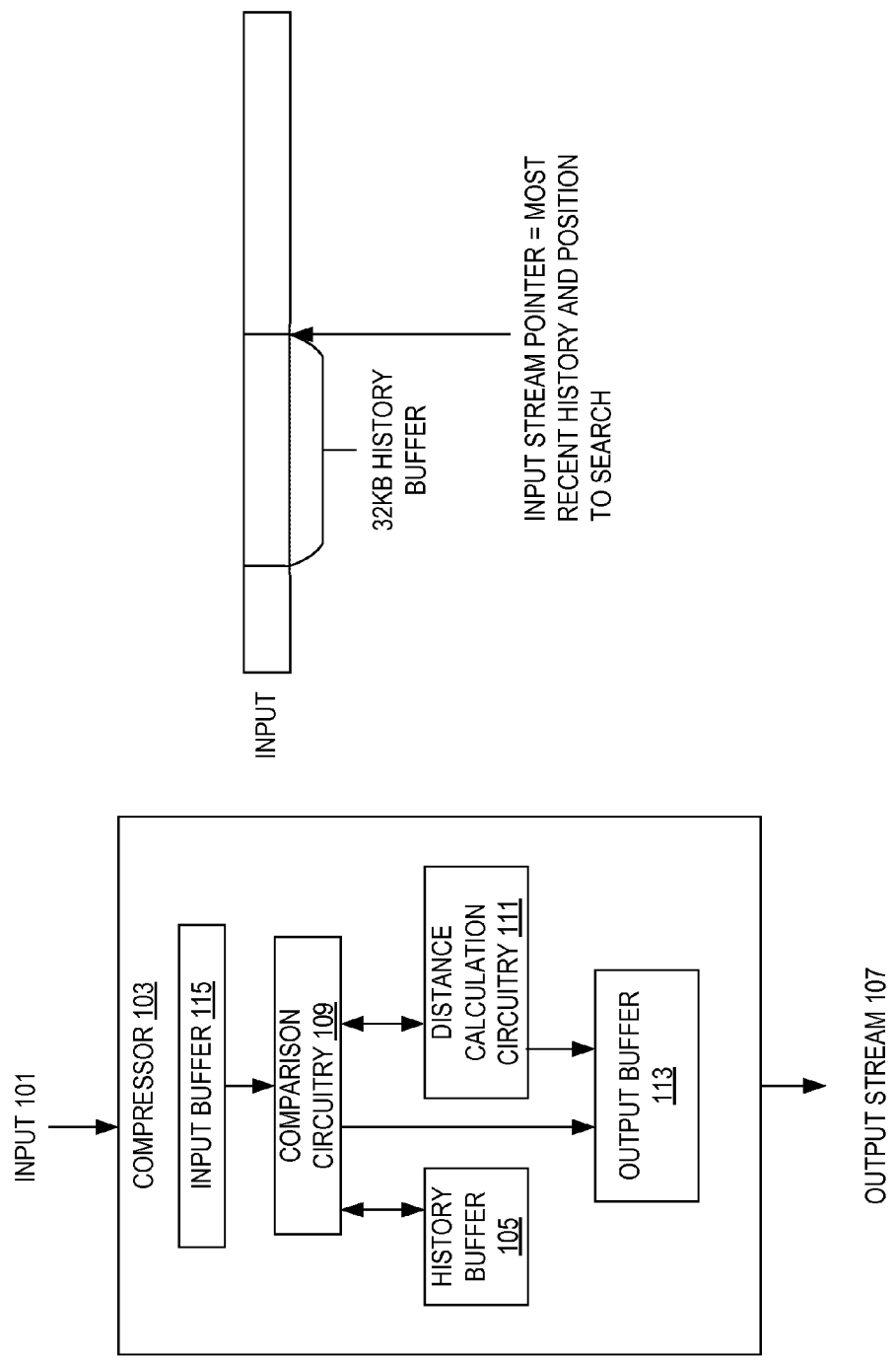
FIG. 1 illustrates an embodiment of a simplified compressor and a view of an input stream.

In the following description, numerous specific details are set forth. However, it is understood that embodiments of the invention may be practiced without these specific details. References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Compression algorithms strive to reduce an amount of data without sacrificing the information within the data. One type of compression algorithm, referred to as the LZ77 algorithm, achieves compression by replacing repeated occurrences of data with references to a single copy of that data existing earlier in the input (uncompressed) data stream. A match is encoded by a pair of numbers called a length-distance pair (the "distance" is sometimes called the "offset" instead). As such, the LZ77 algorithm finds repeated substrings and replaces them with backward references (relative distance offsets). The LZ77 algorithm can use a reference to a duplicated string if the relative distance is less than the maximal history size defined in the algorithm encoding (e.g. 32 KB in Deflate). The compressed data therefore consists of a series of elements of two types: literal bytes (copy of the data) and pointers to replicated strings, where a pointer is represented as a pair <length, backward distance>. The various algorithms in the LZ77 family all find LZ77 string matches during compression, but encode the literals or references differently (e.g. Huffman codes in Deflate, simple byte-oriented packing in Snappy), and have different maximal history windows.

To spot matches, the LZ77 encoder keeps track of some amount of the most recent data, such as the last 2 kB, 4 kB, or 32 kB. The structure in which this data is held is called a "sliding window" (as such, LZ77 is sometimes called sliding window compression). The encoder keeps the most recent data within the sliding window to look for matches (and the decoder likewise will keep this data to interpret the matches the encoder refers to).

FIG. 16 shows a simple example of an LZ77 encoding scheme. As observed in FIG. 16, the bit patterns of a preceding (earlier or older) portion 1601 of a bit stream 100 is compared against a current portion 1602 of the bit stream. If a sequence of bits is found in the current portion 1602 that matches a sequence of bits in the preceding portion 1601, the sequence of bits in the current portion 1602 is replaced with a reference to the same sequence of bits in the earlier portion 1601. For example, the bit sequence in the current portion 1602 would be replaced with a reference to bit sequence 1603 in the earlier portion 1601.

The reference that is inserted for bit sequence 1602 identifies the length 1604 of bit sequence 1602 (which also is the same as the length of bit sequence 1603) and the location of bit sequence 1603. Here, the location of bit sequence 1603 is expressed as a "distance" 1605 from the current portion 1602 to the matching bit sequence 1603. As such, the LZ77 compression scheme encodes a bit sequence 1602 as a "length, distance pair" that is inserted in the bit stream in place of sequence 1602. Upon decoding the compressed stream, when the decoder reaches the length, distance pair that is embedded in the bit stream in place of bit sequence 1602, it simply uses the distance part of the length, distance pair to refer back to the start of bit sequence 1603 and reproduces the correct bit sequence for portion 1602 of the decoded stream by reproducing a number of bits from the start of bit sequence 1603 that is equal to the length component of the length, distance pair.

FIG. 1 illustrates an embodiment of a simplified compressor and a view of an input stream. An uncompressed input stream of literals 101 is input into the compressor 103. This compressor 103 includes a history buffer 105, input buffer 115, pointer storage, match circuitry 109, distance calculation circuitry 111, and an output buffer 113.

The size of the history buffer 105 is tailored to the compression algorithm and the history buffer 105 stores recently encoded unmatched symbols (called literals). Pointer storage tracks where in the input stream the compressor is. In this illustration, the input stream point delineates the most recent history and a position to search.

The input buffer 115 stores literals from the input stream that have not been processed. The match circuitry 109 finds the longest match between the input buffer 115 and the history buffer 105, and the distance calculation circuitry 111 calculates the distance from the start of the longest match in the input buffer 115 to where that matching value begins in the history buffer 105. The length of the longest match found by the match circuitry 109 and the distance found by the distance calculation circuitry 111 makes a length, distance pair. The output buffer 113 stores the literals and length, distance pairs as an output stream 107.

An example of input and output out this compressor is as follows:
Input=abcdeabc
Output=abcde<3,5>

Figure 2:
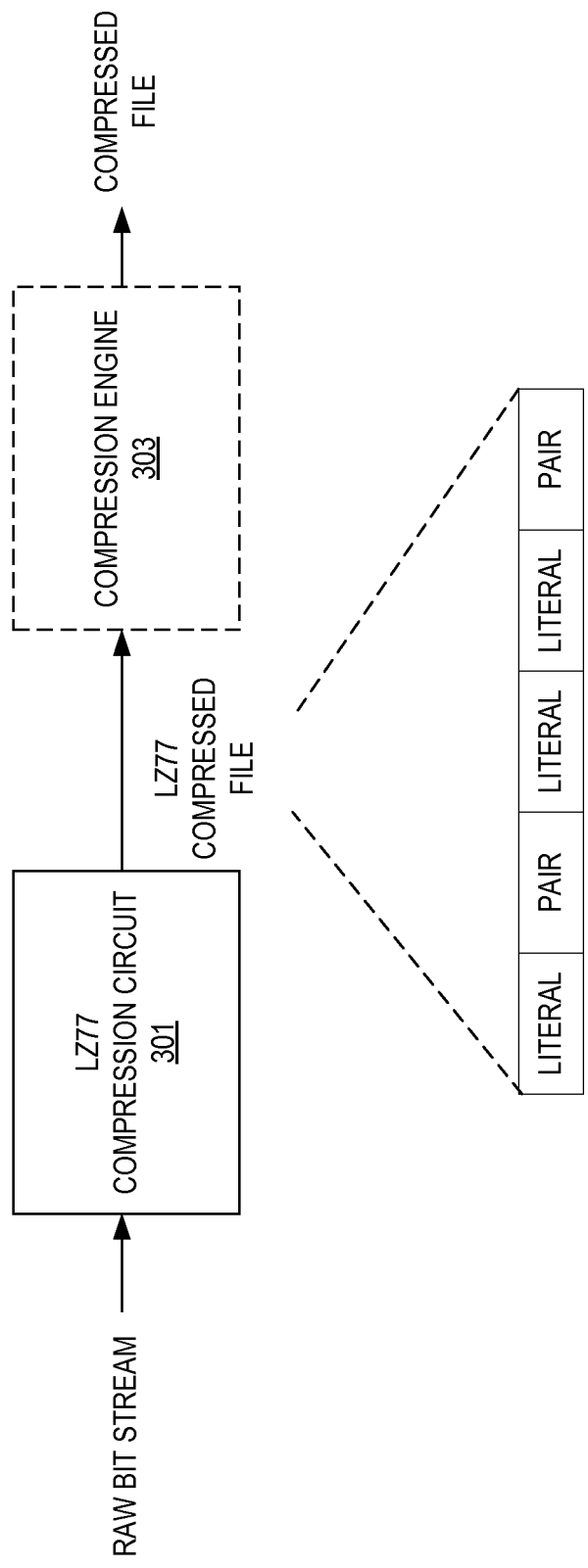
FIG. 2 illustrates an exemplary compression architecture using LZ77 as a base.

FIG. 2 illustrates an exemplary compression architecture using LZ77 as a base. A raw bit stream is input into the LZ77 compression circuitry 201 which outputs a LZ77 compressed file of literals and length, distance pairs. A compression engine 203 (such as DEFALTE, Hadoop, LZS, LZF, or LZ4) takes that compressed file and performs further compression.

Detailed below are embodiments to speed up compression (e.g., of LZ77-based compression algorithms), using a hardware acceleration engine that computes the LZ77 stage of compression using an efficient history buffer size. If software applications need higher compression levels and/or a larger history, then multiple passes through the engine can generate various intermediate streams that software finalizes into the required LZ77 format.

As noted above, a traditional LZ77 compressor will receive an input stream and generate an output stream, where the output stream has literal bytes or references to repeated literals. Compressor hardware (circuitry) embodiments detailed herein operate on two input streams. The first input stream is the same as that used in FIG. 1 and scanning starts at byte 0 of the input file to be compressed.

The second input stream is a "look-ahead" stream which has an offset of (pass−1)*H with respect to the first input stream. H is the history buffer size supported natively in the circuitry, and pass=1, . . . (required-history/H). For a compression that needs a 32 KB history window, but the circuitry supports a 8 KB history buffer, then pass=1 . . . 4 (four passes will be made through the compressor engine). When pass=1, the same behavior as FIG. 1 is expected. When pass=2, the byte where the searching for matches begins is 8 KB ahead of the current data being read (first stream) into the history buffer. Any match found is therefore at a real distance of 8K-16 KB backwards into the history buffer. Likewise, when pass=4, the byte where that is searched for matches is 24 KB ahead of current data and therefore the matches are at a real distance of 24K-32 KB backwards. Note that each of the passes generates output in the same format. Software then takes these four output streams (one from each pass through the hardware compression engine) and then merges them into the final LZ77 format. Each pass therefore evaluates a segment of data history buffer size.

As such, the compression circuitry computes the LZ77 stage of compression using an efficient history buffer size. If software applications need higher compression levels and larger history, then multiple passes through the circuitry generate intermediate streams that software finalizes into the required LZ77 format. The hardware works on two input streams, by basically splitting the history stream from the input stream to be searched for matches. This allows a very scalable approach to hardware design, and in addition permits for effective hardware acceleration on even proprietary compression algorithms based on LZ77.

Figure 3:
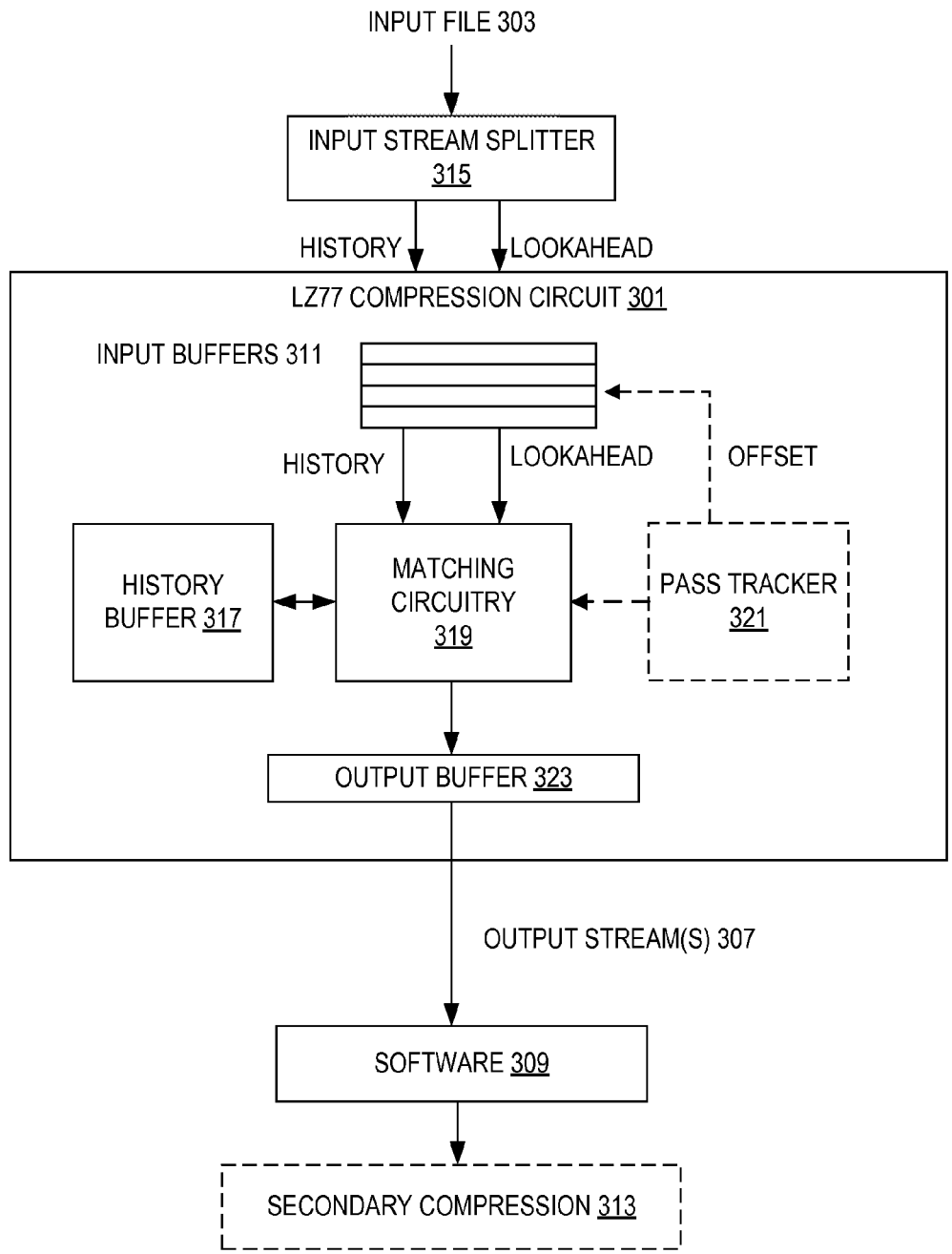
FIG. 3 illustrates an embodiment of a system for LZ77 compression.

FIG. 3 illustrates an embodiment of a system for LZ77 compression. An input file 303 is fed into an input stream splitter 315 to create a first and second input stream (the history and lookahead streams detailed above) by applying an offset. Typically, the input stream splitter 313 is software stored in memory that is running on a processor.

A LZ77 compression circuit 301 performs at least one pass on data of the first and second input streams of the input file 303. These 3 streams are stored in a plurality of input buffers 311 the output of which feeds an input stream splitter 315.

3 In some embodiments, this offset is supplied by pass tracker 321 which tracks each pass and calculates a new offset. In some embodiments, the pass tracker 321 is a part of the matching circuitry 319. Depending upon the implementation, the pass tracker 321 either supplies the offset to the input buffers 311 or matching circuitry 319 for an offset adjustment to be made to the second stream. In other embodiments, the input stream splitter 313 has already made the offset adjustment prior to filling the input buffers 31

Matching circuitry 319 searches for a longest match of the second stream in history buffer 317 (which stores previously processed literals). Match circuitry 319 may use one of many techniques to find a match, including, but not limited to: a brute-force search, or using a linked list or a hash table that point to entries in the history buffer.

The output of the matching circuitry 319 is (interleaved) literals and references as detailed herein which are stored in at least one output buffer 323 as intermediate streams. In some embodiments, an output buffer 323 per pass is provided.

The output of the compression circuit 301 is the one or more intermediate streams from the output buffers 323. These intermediate streams are processed by software 309 to merge them and then supplied to secondary compression engine(s) 313 as needed.

Figure 4:
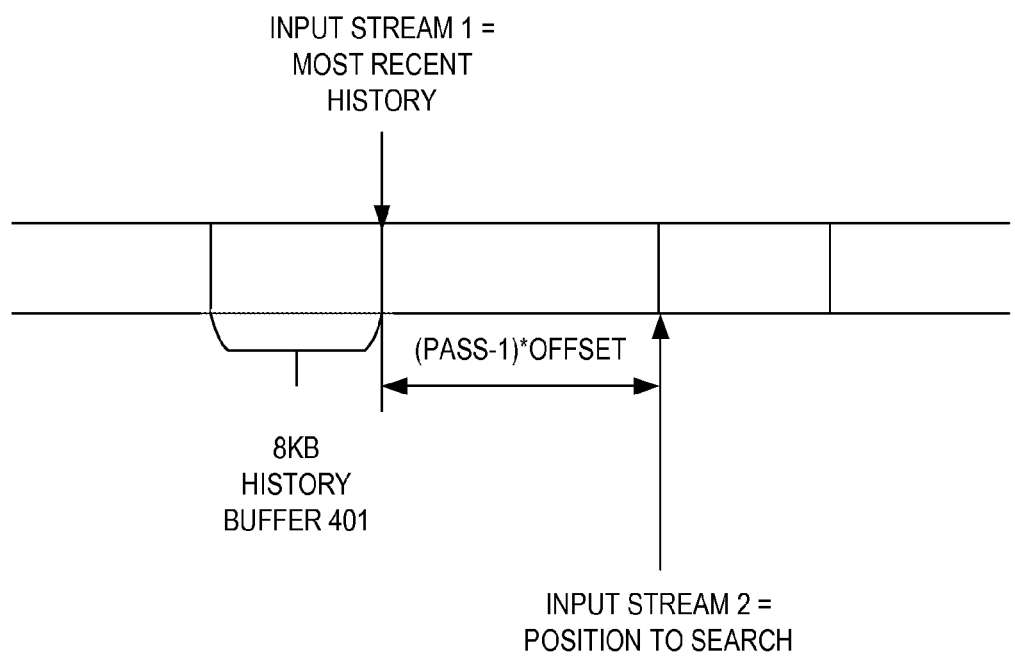
FIG. 4 illustrates an embodiment of processing input with a two stream input approach.

FIG. 4 illustrates an embodiment of processing input with a two stream input approach. A history buffer 401 (shown as 8 KB, however, other sizes may be used) stores previously processed literals. Input stream 1 is the stream associated with the most recent history as detailed above. Input stream 2 is the stream to search and is separated from input stream 1 by a value of an offset multiplied by a result of the pass number minus one (in other words (pass−1)*offset). In the first pass, the streams are equal. In the second pass, the input stream 2 is an offset from input stream 1.

Figure 5:
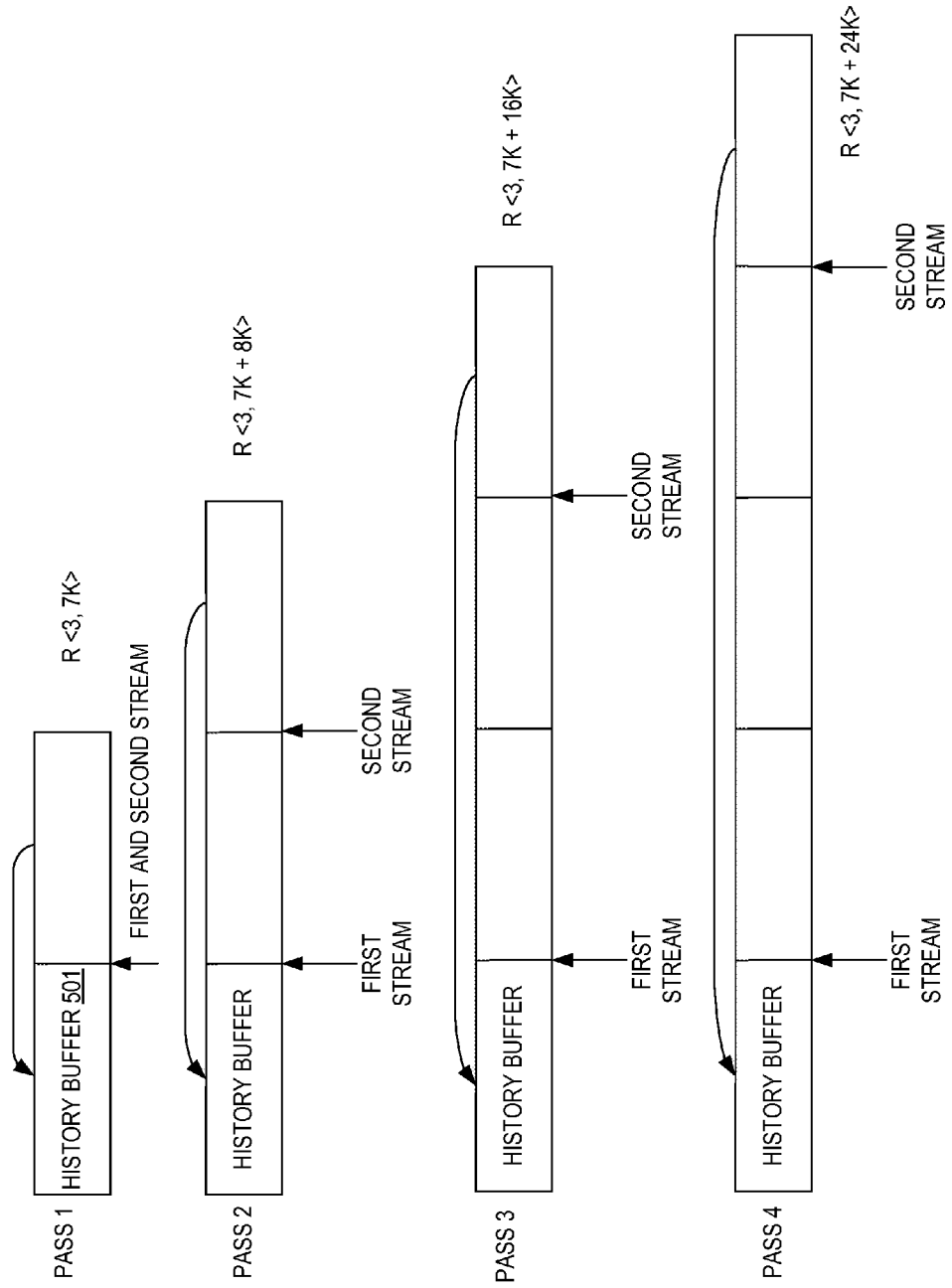
FIG. 5 illustrates the position of the two input streams in relation to the history buffer according to an embodiment.

FIG. 5 illustrates the position of the two input streams in relation to the history buffer according to an embodiment. In pass 1, the matching circuitry (for example, matching circuitry 319) attempts to find matches from the first/second stream with entries in the history buffer 501. An example of a match will be output as reference length, distance pair such as R<3, 7K> which indicates 3 literals match and a backward reference into the history buffer of 7K.

In pass 2, the matching circuitry (for example, matching circuitry 319) attempts to find matches from the second stream, which is an offset farther away from the history buffer, with entries in the history buffer 501. An example of a match will be output as reference length, distance pair such as R<3, 7K+8K> which indicates 3 literals match and a backward reference into the history buffer of 7K plus an 8K offset.

In pass 3, the matching circuitry (for example, matching circuitry 319) attempts to find matches from the second stream, which is an additional offset farther away from the history buffer, with entries in the history buffer 501. An example of a match will be output as reference length, distance pair such as R<3, 7K+16K> which indicates 3 literals match and a backward reference into the history buffer of 7K plus a 16K offset.

In pass 4, the matching circuitry (for example, matching circuitry 319) attempts to find matches from the second stream, which is an additional offset farther away from the history buffer, with entries in the history buffer 501. An example of a match will be output as reference length, distance pair such as R<3, 7K+24K> which indicates 3 literals match and a backward reference into the history buffer of 7K plus a 24K offset.

Figure 6:
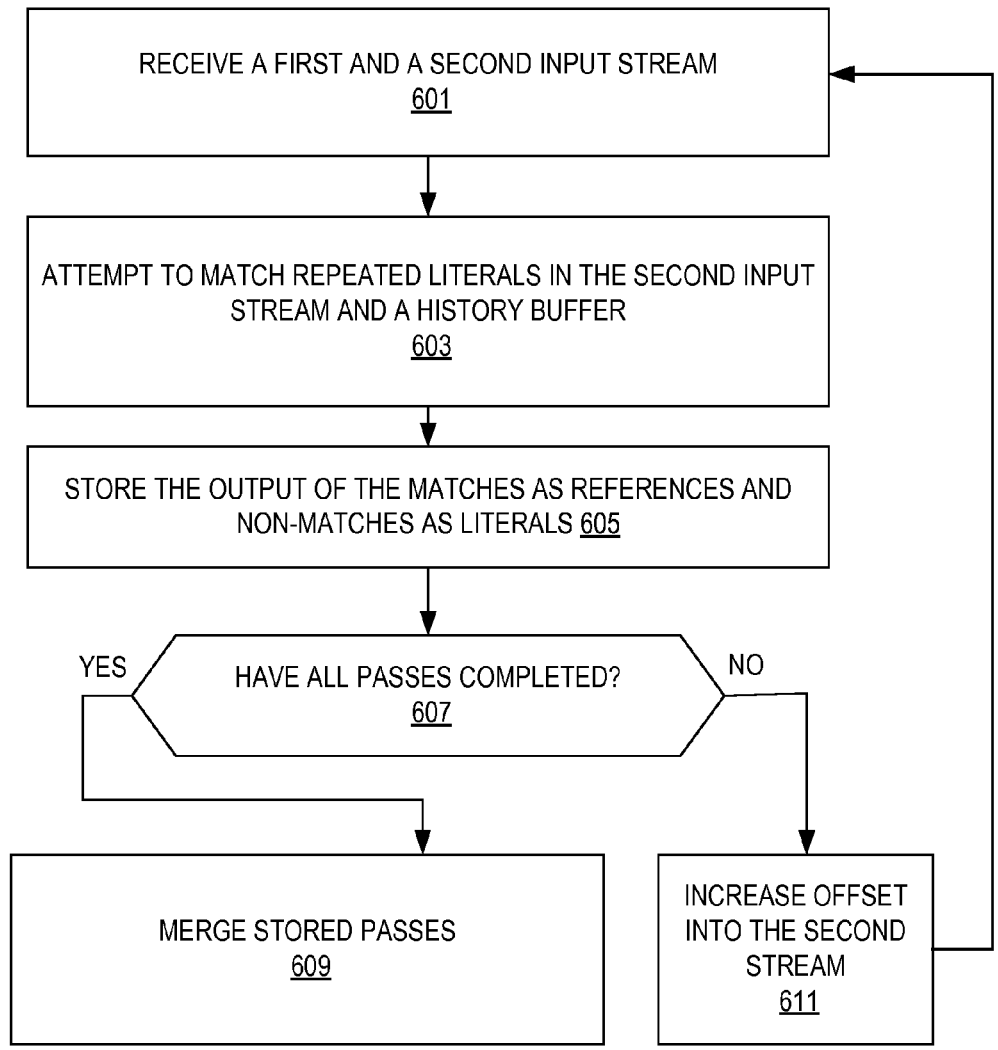
FIG. 6 illustrates an embodiment of a method performed by a LZ77 compression circuit.

FIG. 6 illustrates an embodiment of a method performed by a LZ77 compression circuit. At 601, a first and second input stream are received. The first input stream is a "history" stream (a portion of an input file most recently processed) and the second input stream is a "lookahead" stream to be searched for matches (it follows the history stream). In an initial pass (for example, pass 1), the first and second streams are the same. In later passes, the second input stream is an "offset" away from the history stream as detailed above. For example, the second input stream is (pass−1)*8 KB away from the first input stream. The first stream supplies a history buffer with literals (e.g., the first 8 KB of literals from the first stream).

Logic within the compression circuit (such as match circuitry 319) attempts to find one or more literal strings of the second that are have matches in the history buffer at 603. For all literals without a corresponding match, that literal is output into an output buffer (such as output buffer 323) and when a literal string match is found, a backward reference is output as a length, distance pair to the output buffer at GAD05. Each time through 601-605 is called a pass.

In some embodiments, the matching does not have to be computed with the same effort levels. For example, the minimum size for a match (min-match) may be 2 bytes, 3 bytes, etc. In some embodiments, different values of min-match are used depending upon which pass is being performed (e.g., 2 byte min-match for a 1st pass, 3-byte for a 2nd pass, and 4-byte for rest).

A determination of if all of the passes requested have been performed is made at 607. The number of passes is typically determined by the required history of the compression algorithm as detailed above. When all of the passes have not completed, an offset is increased based on the pass number and applied to the second input stream at GAD11. As example of this is shown in FIG. 5. Both the determination and offset increase are performed by pass tracker 321 according to an embodiment. The offset input streams are then processed for matching, etc.

When all passes have completed, the passes stored in the output buffer are merged by software to create a unified literal and reference output at 609. In most embodiments, the merging begins by finding a common literal as a starting point.

FIG. 15 illustrates an example of merging multiple intermediate output streams. For simplicity only two outputs are merged, but this is easy to extend to any number. L is a literal byte, and R<len, dist> is a reference. The figures show how the literals or references map to bytes of the input file. In this example, the passes are aligned so that they refer to the same starting byte position in the input file which is shown as L0. In other words, L0 is a special indicator to show that each pass has been scanned to find a common literal in the input file that they refer to.

Aligned pass 1, starts with the align literal. This is followed by four literals until the first matching string is found which is shown as R<3, 7K>. The matching string is followed by three more literals, another match, and another literal. In pass 1, the input streams are the same.

In pass 2, the streams are offset by 8K (the input is 8K ahead of stream 1). Aligned pass 2, again starts with the align literal. This is followed by a match R<3,4K>, three literals, another match, and three more literals. Note that the compression circuitry has not corrected for the offset so pass 2's first match of 4K back is not correct and needs to be corrected during the merge.

The merge, typically, done by software, starts with the align literal. During merge, at any given position in the pass outputs, references are chosen over literals such that the output size is minimized. Additionally, offsets are applied to the references to reflect the appropriate distance into the history buffer for that pass. For example, for a reference of pass 2, an offset of 8K would be added to the distance value. When references overlap, a truncation of the reference that is "later" in the output passes is truncated as will be discussed.

Note that when references are taken from the 2nd pass, the distances are adjusted by adding 8K (or 16K for the 3rd pass and so on). As such, the distance that was found in pass 2 of 4K is actually 4K+8K and that value (12K) is stored in the reference. Following this reference, neither pass found a match and so the literal is placed in the merged stream. Further, references do not have to be used with the original length; a smaller length string can be used so long as it is at least as long as the min-match defined in the standard.

The next matching string in the sequence is found in pass 1 (R<3,7k>). This is not found in pass 2. However, there is an overlap in pass 2 with that match. In this instance, the reference from pass 1 (the earlier one) is chosen, and the reference in pass 2 is truncated. So the reference from pass 2 is no longer has a length of 5, but is shortened to a length 3 (and the offset is added). This reference loses length on the front by 1 and on the back by 1 from the matches found in pass 1.

Detailed below are exemplary core architectures, processors, and architectures that may utilize the above described embodiments.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 7A is a block diagram illustrating both an exemplary in-order pipeline and an exemplary register renaming, out-of-order issue/execution pipeline according to embodiments of the invention. FIG. 7B is a block diagram illustrating both an exemplary embodiment of an in-order architecture core and an exemplary register renaming, out-of-order issue/execution architecture core to be included in a processor according to embodiments of the invention. The solid lined boxes in FIGS. 7A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 7A, a processor pipeline 700 includes a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724.

FIG. 7B shows processor core 790 including a front end unit 730 coupled to an execution engine unit 750, and both are coupled to a memory unit 770. The core 790 may be a reduced instruction set computing (RISC) core, a complex instruction set computing (CISC) core, a very long instruction word (VLIW) core, or a hybrid or alternative core type. As yet another option, the core 790 may be a special-purpose core, such as, for example, a network or communication core, compression engine, coprocessor core, general purpose computing graphics processing unit (GPGPU) core, graphics core, or the like.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (or decoder) may decode instructions, and generate as an output one or more micro-operations, microcode entry points, microinstructions, other instructions, or other control signals, which are decoded from, or which otherwise reflect, or are derived from, the original instructions. The decode unit 740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 790 includes a microcode ROM or other medium that stores microcode for certain macroinstructions (e.g., in decode unit 740 or otherwise within the front end unit 730). The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different schedulers, including reservations stations, central instruction window, etc. The scheduler unit(s) 756 is coupled to the physical register file(s) unit(s) 758. Each of the physical register file(s) units 758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 758 comprises a vector registers unit, a write mask registers unit, and a scalar registers unit. These register units may provide architectural vector registers, vector mask registers, and general purpose registers. The physical register file(s) unit(s) 758 is overlapped by the retirement unit 754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 754 and the physical register file(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 756, physical register file(s) unit(s) 758, and execution cluster(s) 760 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which includes a data TLB unit 772 coupled to a data cache unit 774 coupled to a level 2 (L2) cache unit 776. In one exemplary embodiment, the memory access units 764 may include a load unit, a store address unit, and a store data unit, each of which is coupled to the data TLB unit 772 in the memory unit 770. The instruction cache unit 734 is further coupled to a level 2 (L2) cache unit 776 in the memory unit 770. The L2 cache unit 776 is coupled to one or more other levels of cache and eventually to a main memory.

By way of example, the exemplary register renaming, out-of-order issue/execution core architecture may implement the pipeline 700 as follows: 1) the instruction fetch 738 performs the fetch and length decoding stages 702 and 704; 2) the decode unit 740 performs the decode stage 706; 3) the rename/allocator unit 752 performs the allocation stage 708 and renaming stage 710; 4) the scheduler unit(s) 756 performs the schedule stage 712; 5) the physical register file(s) unit(s) 758 and the memory unit 770 perform the register read/memory read stage 714; the execution cluster 760 perform the execute stage 716; 6) the memory unit 770 and the physical register file(s) unit(s) 758 perform the write back/memory write stage 718; 7) various units may be involved in the exception handling stage 722; and 8) the retirement unit 754 and the physical register file(s) unit(s) 758 perform the commit stage 724.

The core 790 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 790 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 734/774 and a shared L2 cache unit 776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 8B:
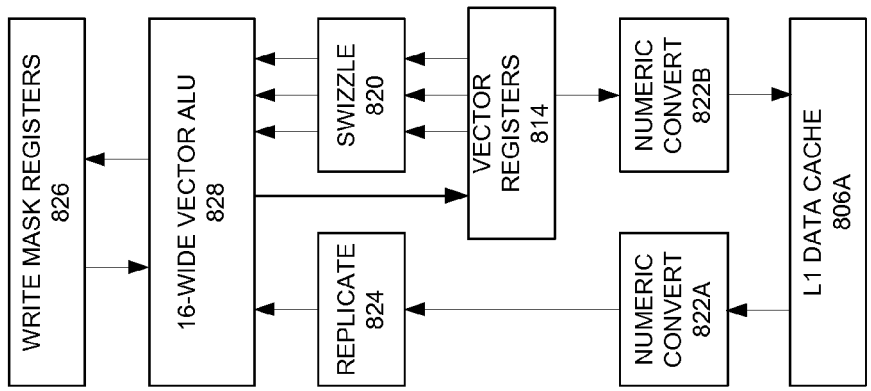
FIGS. 8A-B illustrate a block diagram of a more specific exemplary in-order core architecture, which core would be one of several logic blocks (including other cores of the same type and/or different types) in a chip.
Figure 8A:
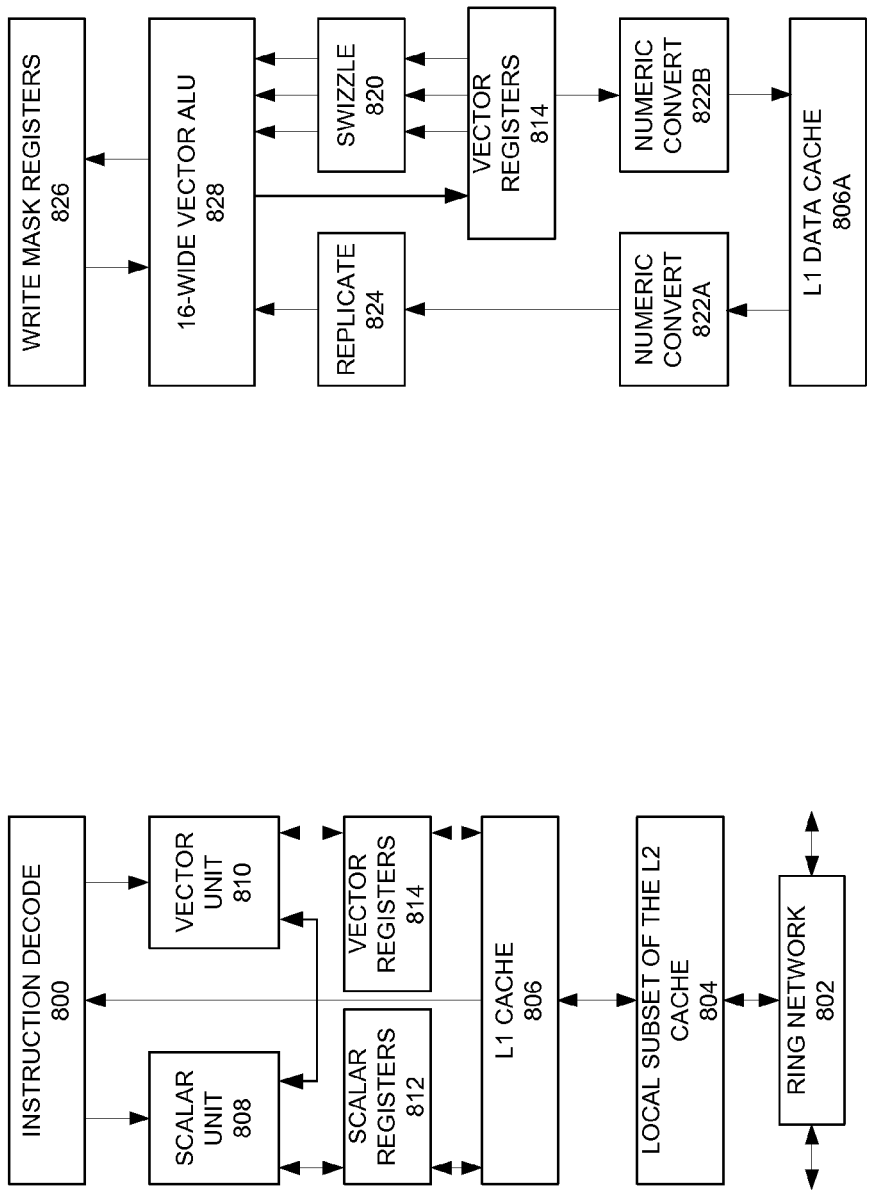

FIGS. 8A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 8A is a block diagram of a single processor core, along with its connection to the on-die interconnect network 802 and with its local subset of the Level 2 (L2) cache 804, according to embodiments of the invention. In one embodiment, an instruction decoder 800 supports the x86 instruction set with a packed data instruction set extension. An L1 cache 806 allows low-latency accesses to cache memory into the scalar and vector units. While in one embodiment (to simplify the design), a scalar unit 808 and a vector unit 810 use separate register sets (respectively, scalar registers 812 and vector registers 814) and data transferred between them is written to memory and then read back in from a level 1 (L1) cache 806, alternative embodiments of the invention may use a different approach (e.g., use a single register set or include a communication path that allow data to be transferred between the two register files without being written and read back).

The local subset of the L2 cache 804 is part of a global L2 cache that is divided into separate local subsets, one per processor core. Each processor core has a direct access path to its own local subset of the L2 cache 804. Data read by a processor core is stored in its L2 cache subset 804 and can be accessed quickly, in parallel with other processor cores accessing their own local L2 cache subsets. Data written by a processor core is stored in its own L2 cache subset 804 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 8B is an expanded view of part of the processor core in FIG. 8A according to embodiments of the invention. FIG. 8B includes an L1 data cache 806A part of the L1 cache 804, as well as more detail regarding the vector unit 810 and the vector registers 814. Specifically, the vector unit 810 is a 16-wide vector processing unit (VPU) (see the 16-wide ALU 828), which executes one or more of integer, single-precision float, and double-precision float instructions. The VPU supports swizzling the register inputs with swizzle unit 820, numeric conversion with numeric convert units 822A-B, and replication with replication unit 824 on the memory input. Write mask registers 826 allow predicating resulting vector writes.

Processor with Integrated Memory Controller and Graphics

Figure 9:
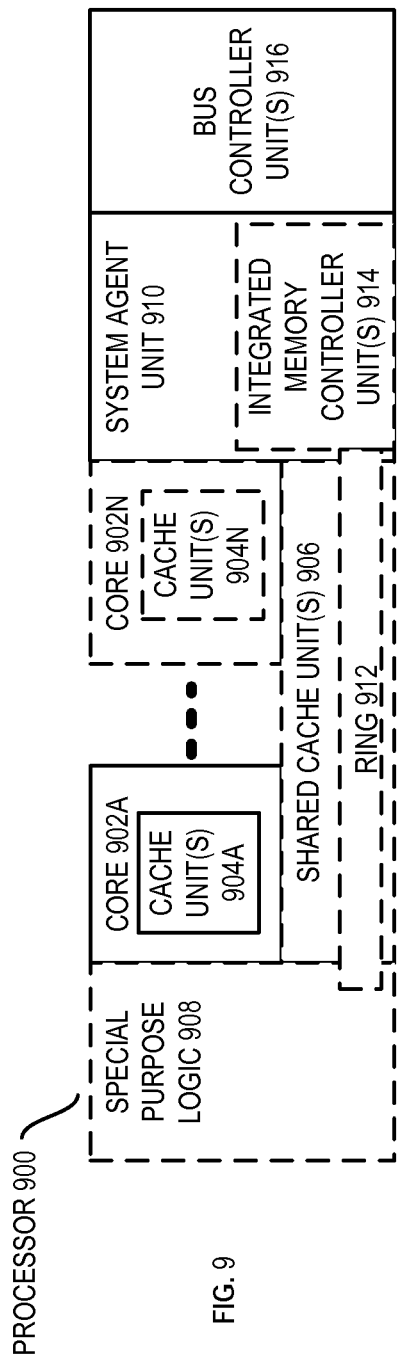
FIG. 9 is a block diagram of a processor 900 that may have more than one core, may have an integrated memory controller, and may have integrated graphics according to embodiments of the invention.

FIG. 9 is a block diagram of a processor 900 that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the integrated graphics logic 908, the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multi-threading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary Computer Architectures

FIGS. 10-13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
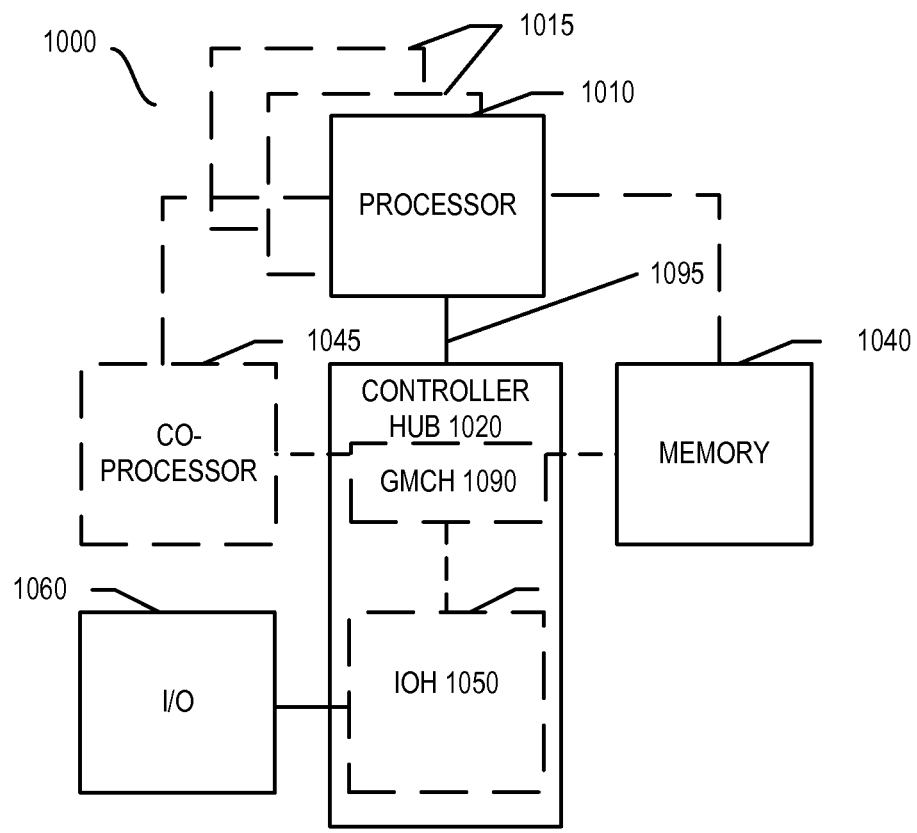
FIGS. 10-13 are block diagrams of exemplary computer architectures.

Referring now to FIG. 10, shown is a block diagram of a system 1000 in accordance with one embodiment of the present invention. The system 1000 may include one or more processors 1010, 1015, which are coupled to a controller hub 1020. In one embodiment the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 is couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processing cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface such as QuickPath Interconnect (QPI), or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the physical resources 1010, 1015 in terms of a spectrum of metrics of merit including architectural, microarchitectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor(s) 1045 accept and execute the received coprocessor instructions.

Figure 11:
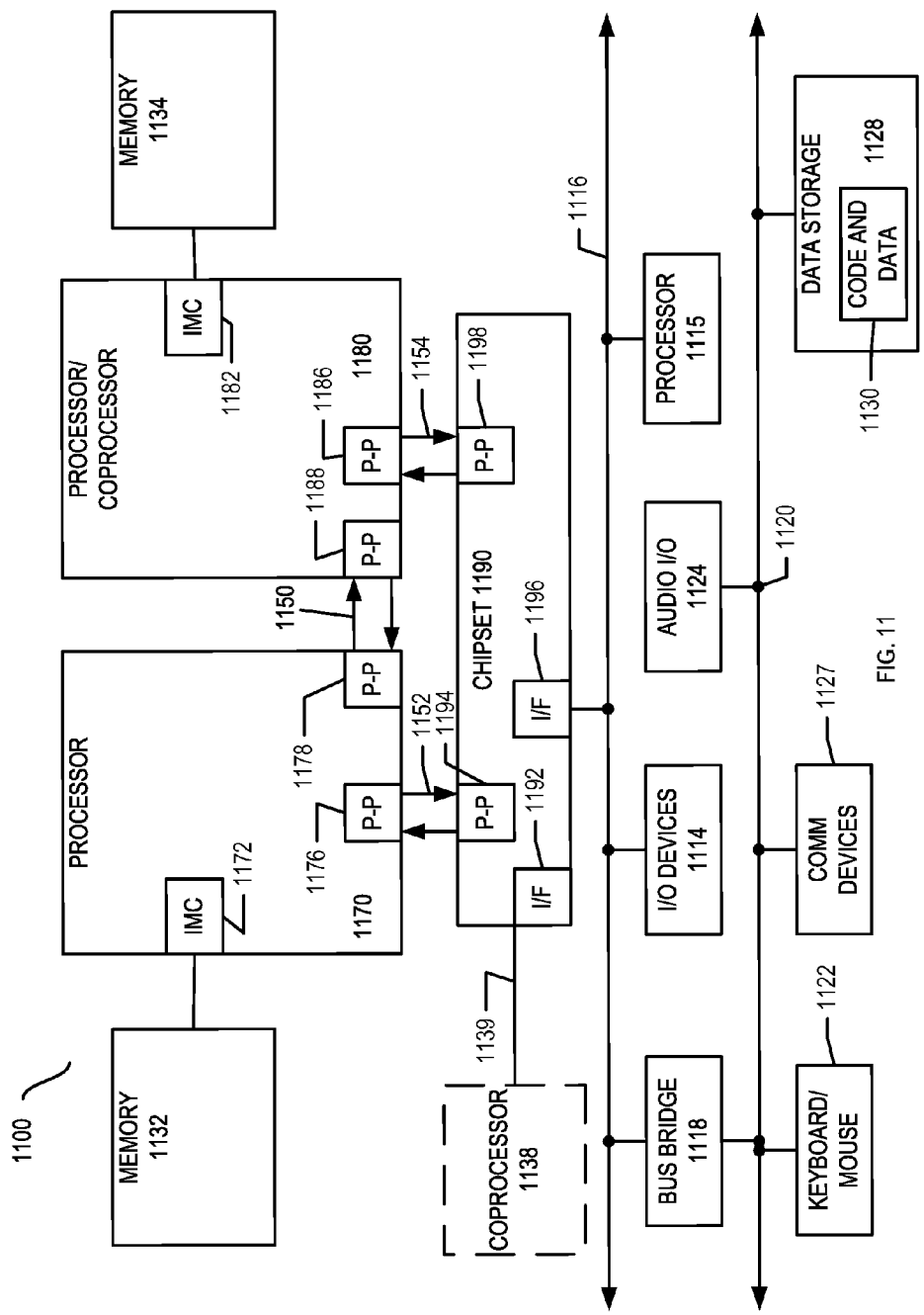

Referring now to FIG. 11, shown is a block diagram of a first more specific exemplary system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment of the invention, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1139. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present invention is not so limited.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) units), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to the second bus 1120. Note that other architectures are possible. For example, instead of the point-to-point architecture of FIG. 11, a system may implement a multi-drop bus or other such architecture.

Figure 12:
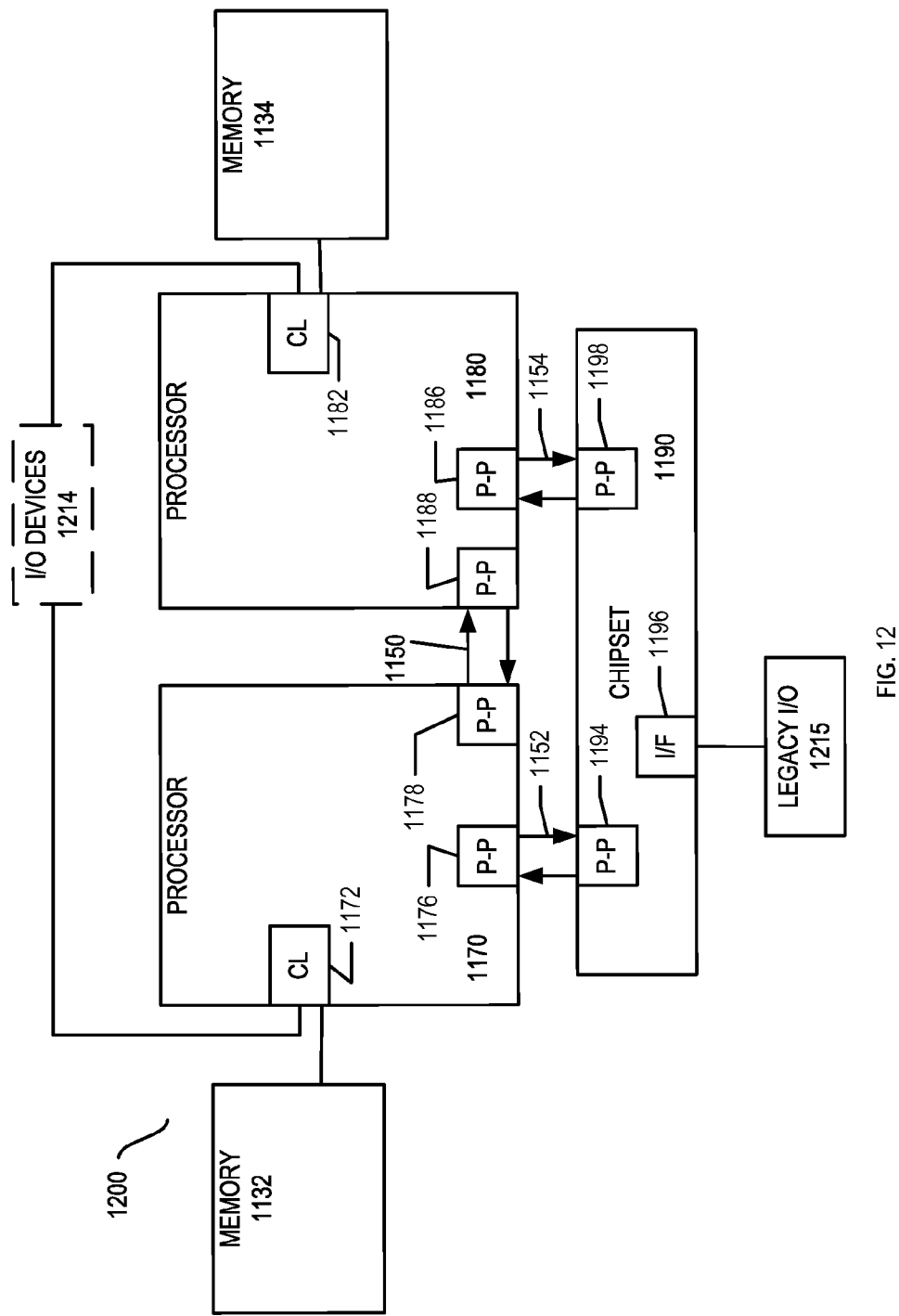

Referring now to FIG. 12, shown is a block diagram of a second more specific exemplary system 1200 in accordance with an embodiment of the present invention. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1172 and 1182, respectively. Thus, the CL 1172, 1182 include integrated memory controller units and include I/O control logic. FIG. 12 illustrates that not only are the memories 1132, 1134 coupled to the CL 1172, 1182, but also that I/O devices 1214 are also coupled to the control logic 1172, 1182. Legacy I/O devices 1215 are coupled to the chipset 1190.

Figure 13:
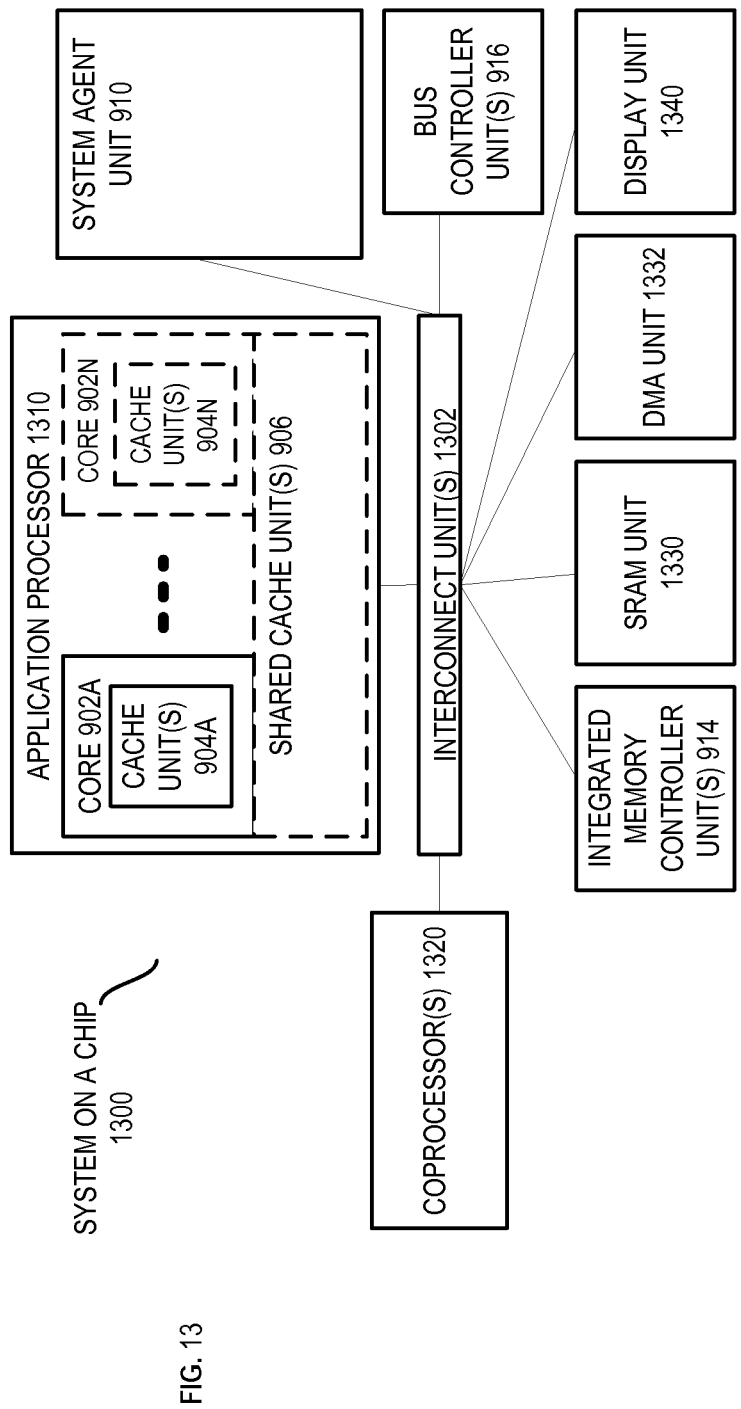

Referring now to FIG. 13, shown is a block diagram of a SoC 1300 in accordance with an embodiment of the present invention. Similar elements in FIG. 9 bear like reference numerals. Also, dashed lined boxes are optional features on more advanced SoCs. In FIG. 13, an interconnect unit(s) 1302 is coupled to: an application processor 1310 which includes a set of one or more cores 202A-N and shared cache unit(s) 906; a system agent unit 910; a bus controller unit(s) 916; an integrated memory controller unit(s) 914; a set or one or more coprocessors 1320 which may include integrated graphics logic, an image processor, an audio processor, and a video processor; an static random access memory (SRAM) unit 1330; a direct memory access (DMA) unit 1332; and a display unit 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 14:
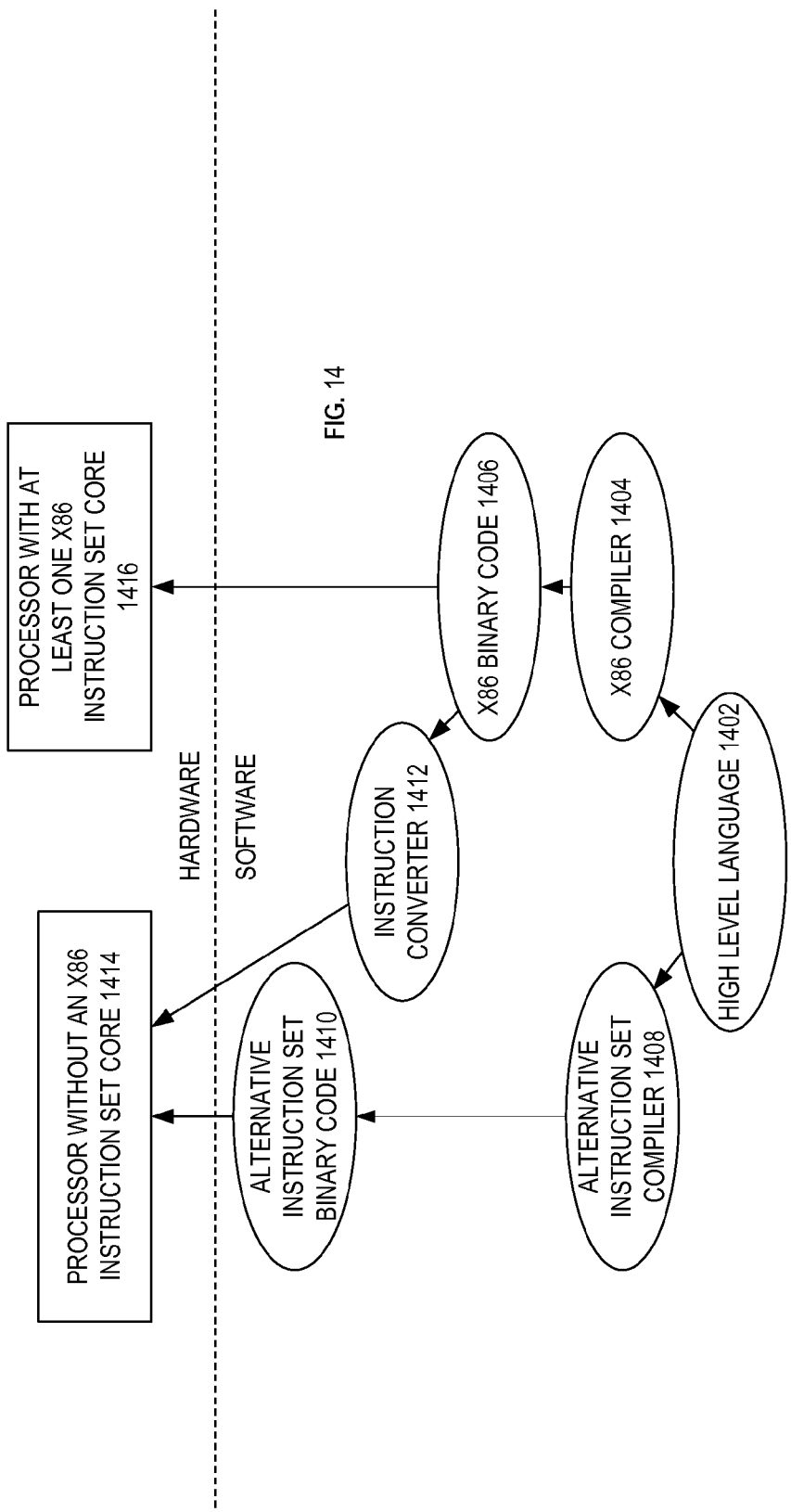
FIG. 14 is a block diagram contrasting the use of a software instruction converter to convert binary instructions in a source instruction set to binary instructions in a target instruction set according to embodiments of the invention.

FIG. 14 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 14 shows a program in a high level language 1402 may be compiled using an x86 compiler 1404 to generate x86 binary code 1406 that may be natively executed by a processor with at least one x86 instruction set core 1416. The processor with at least one x86 instruction set core 1416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1404 represents a compiler that is operable to generate x86 binary code 1406 (e.g., object code) that can, with or without additional linkage processing, be executed on the processor with at least one x86 instruction set core 1416. Similarly, FIG. 14 shows the program in the high level language 1402 may be compiled using an alternative instruction set compiler 1408 to generate alternative instruction set binary code 1410 that may be natively executed by a processor without at least one x86 instruction set core 1414 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1412 is used to convert the x86 binary code 1406 into code that may be natively executed by the processor without an x86 instruction set core 1414. This converted code is not likely to be the same as the alternative instruction set binary code 1410 because an instruction converter capable of this is difficult to make; however, the converted code will accomplish the general operation and be made up of instructions from the alternative instruction set. Thus, the instruction converter 1412 represents software, firmware, hardware, or a combination thereof that, through emulation, simulation or any other process, allows a processor or other electronic device that does not have an x86 instruction set processor or core to execute the x86 binary code 1406.

We claim:

1. An hardware apparatus comprising:
   a history buffer to store a plurality of literals; and
   matching circuitry to operate
      a first pass on a first and a second input stream to output literals and backward references when a string of literals in the second input streams matches a string of literals in the history buffer,
      a second pass on the first and the second input stream to output literals and backward references when a string of literals in the second input streams matches a string of literals in the history buffer, wherein the first and the second input stream are the same stream in the first pass and the second stream is an offset of the first stream in the second pass such that references found in the second pass have a offset that is an size of the history buffer times a pass number away from the history buffer, wherein the history buffer is to be constructed from the first input stream.

2. The hardware apparatus of claim 1, wherein the offset is a multiple of 8 kB.

3. The hardware apparatus of claim 1, further comprising:
   a pass tracker to track a number of passes performed by the matching circuitry.

4. The hardware apparatus of claim 1, wherein the offset 8 kB multiplied by the number of passes performed minus one.

5. The hardware apparatus of claim 1, wherein the history buffer is to store 8 kB of literals.

6. The hardware apparatus of claim 1, wherein the hardware apparatus to feed a software executed by processor to merge each pass.

7. The hardware apparatus of claim 1, further comprising memory to store a stream splitter routine to split an input stream into the first and second input streams.

8. The hardware apparatus of claim 1, further comprising at least one output buffer to store each pass.

9. A method comprising:
   in a hardware accelerator,
      receiving a first and a second input stream in a hardware accelerator,
      storing literals from the first stream into a history buffer,
      performing a plurality of passes on the first and second input stream to output literals and backward references when a string of literals in the second input streams matches a string of literals in the history buffer, wherein for each successive pass the second input stream is offset from the first stream that references found in the second pass have a offset that is an size of the history buffer times a pass number away from the history buffer, and
      storing a result of each pass in a output buffer.

10. The method of claim 1, further comprising:
    in software executing on a processor coupled to the hardware accelerator,
       merging each of the passes stored in the output buffer by,
          aligning the passes to begin with a common literal,
          at a given position in the passes, choosing a reference over a literal and adding an offset appropriate for the pass that contained the literal, and
          outputting literals in positions without references and the chosen references.

11. The method of claim 10, further comprising:
    truncating a length of a reference when there is reference overlap.

12. The method of claim 10, wherein the common literal is indicated with a special character.

13. The method of claim 9, wherein the offset is a multiple of 8 kB.

14. The method of claim 9, wherein the offset 8 kB multiplied by the number of passes performed minus one.

15. The method of claim 9, wherein the history buffer is to store 8 kB of literals.

16. The method of claim 9, further comprising:
    generating the first and second streams from an input stream using a stream splitter routine.

\* \* \* \* \*